(12) United States Patent
Sugino et al.

(10) Patent No.: US 8,704,378 B2
(45) Date of Patent: Apr. 22, 2014

(54) SEMICONDUCTOR DEVICE

(75) Inventors: Mitsuo Sugino, Tokyo (JP); Satoru Katsurayama, Tokyo (JP); Hiroyuki Yamashita, Tokyo (JP)

(73) Assignee: Sumitomo Bakelite Co., Ltd., Tokyo (JP)

( * ) Notice: Subject to any disclaimer, the term of this patent is extended or adjusted under 35 U.S.C. 154(b) by 1301 days.

(21) Appl. No.: 11/887,235

(22) PCT Filed: May 15, 2007

(86) PCT No.: PCT/JP2007/000518
§ 371 (c)(1),
(2), (4) Date: Sep. 27, 2009

(87) PCT Pub. No.: WO2007/135768
PCT Pub. Date: Nov. 29, 2007

(65) Prior Publication Data
US 2010/0181686 A1 Jul. 22, 2010

(30) Foreign Application Priority Data
May 19, 2006 (JP) .................... 2006-139712

(51) Int. Cl.
*H01L 23/48* (2006.01)
(52) U.S. Cl.
USPC .................... 257/777; 257/E23.169
(58) Field of Classification Search
USPC .................. 257/685, 686, 700, 778, E23.038, 257/E23.085, E23.169, E23.173
See application file for complete search history.

(56) References Cited

U.S. PATENT DOCUMENTS

| 6,483,718 | B2 | 11/2002 | Hashimoto | |
|---|---|---|---|---|
| 2004/0222522 | A1* | 11/2004 | Homma | 257/737 |

(Continued)

FOREIGN PATENT DOCUMENTS

| JP | 7-183426 | 7/1995 |
|---|---|---|
| JP | 11-8474 | 1/1999 |

(Continued)

OTHER PUBLICATIONS

Korean Office Action issued on Jul. 30, 2008.

(Continued)

*Primary Examiner* — Vongsavanh Sengdara
(74) *Attorney, Agent, or Firm* — Smith, Gambrell & Russell, LLP

(57) ABSTRACT

A semiconductor device 1 is equipped with a first substrate 3 on which a first semiconductor chip 2 is mounted, a second substrate 5 on which a second semiconductor chip 4 is mounted, and connecting sections 6 that electrically connect the first substrate 3 and the second substrate 5. The first substrate 3 has build-up layers 31A and 31B in each of which an insulating layer 311 containing a resin and conductor interconnect layers 312 and 313 are laminated alternately, and the respective conductor interconnect layers 312 are connected by a conductive layer 314 provided in via holes of the insulating layers 311. The second substrate 5 also has build-up layers 31A and 31B. In the insulating layers 311 of the build-up layers in at least one substrate of the first substrate 3 and the second substrate 5, the average coefficient of thermal expansion of at least one insulating layer along the substrate inplane direction at from 25 degrees centigrade to the glass transition point is 35 ppm/degrees centigrade or less, and the average coefficient of thermal expansion along the substrate thickness direction is 35 ppm/degrees centigrade or less.

18 Claims, 9 Drawing Sheets

(56) References Cited

U.S. PATENT DOCUMENTS

2004/0227258 A1* 11/2004 Nakatani .................. 257/787
2007/0087479 A1* 4/2007 Lu et al. .................. 438/108

FOREIGN PATENT DOCUMENTS

| JP | 200-294922 | 10/2000 |
|----|------------|---------|
| JP | 2002-83922 | 3/2002 |
| JP | 2002-299828 | 10/2002 |
| JP | 2003-318361 | 11/2003 |
| JP | 2004-71656 | 3/2004 |
| JP | 2005-262513 | 9/2005 |

OTHER PUBLICATIONS

Japanese Office Action issued on Jun. 14, 2011 for Application No. 2008-516554.

* cited by examiner

SEMICONDUCTOR DEVICE

TECHNICAL FIELD

The present invention relates to a semiconductor device, in particular to a semiconductor device with a plurality of semiconductor chips laminated thereon.

BACKGROUND ART

Along with recent requirements for advanced functions and lighter and more compact configurations of electric devices, electronic components have been aimed for high-density integration, and further high density implementation. Accordingly, substrates on which the electronic components including semiconductor packages are implemented have become highly miniaturized.

As a semiconductor device that realizes a high-density implementation, a semiconductor device of package on package (POP) structure has been proposed wherein a first semiconductor chip is mounted onto a substrate, and further a second semiconductor chip is mounted onto the first semiconductor chip (Patent Document 1).

[Patent Document 1]
Japanese Patent Laid-Open Publication No. H07-183426

DISCLOSURE OF THE INVENTION

Problems to be Solved by the Invention

However, in such a package on package (POP) structure as described in the Patent Document 1, there have been problems as shown below.

Generally, the coefficient of thermal expansion is different between a substrate and a semiconductor chip. The substrate is composed of a raw material containing a resin, and has a larger coefficient of thermal expansion than the semiconductor chip. If the semiconductor device of the structure where the semiconductor chip is implemented on the substrate receives a heat history, warpage occurs in the substrate. And due to this warpage in the substrate, conductive failure may occur between the semiconductor chip and the substrate, leading to deterioration of connection reliability.

In addition, in recent years, since use of high frequency as clock frequency of the semiconductor chip has been progressing rapidly, a substrate that can reduce inductance is required for the substrate on which semiconductor chips are implemented. In the substrate which has a core layer and build-up layers, the inductance of through-hole of the core layer is extremely large. In order to respond to the request for the reduction of inductance, it has been proposed to make the core layer as thin as possible, or to use the substrate that is composed of only the build-up layers, without the core layer.

Generally, since the core layer is prepared in order to reduce the coefficient of thermal expansion of the substrate, when the core layer is made thin or the substrate which is composed of only the build-up layers is used, the warpage of the substrate at the moment of receiving the heat history increases. Therefore, conductive failure is liable to occur between the semiconductor chip and the substrate.

The object of the present invention is to provide a semiconductor device which can reduce the occurrence of conductive failure and can control the decrease of the connection reliability between a substrate and a semiconductor chip.

According to the present invention, there is provided a semiconductor device that includes a first substrate on which a first semiconductor chip is mounted, a second substrate on which a second semiconductor chip is mounted, and connecting sections that contact the front surface of said first substrate and the back surface of said second substrate and electrically connect said first substrate and said second substrate, wherein said first substrate has a build-up layer in which insulating layers containing resin and conductor interconnect layers are laminated alternately, and said each conductor interconnect layer is connected by a conductive layer arranged in a hole of said insulating layer, said second substrate has a build-up layer in which insulating layers containing resin and conductor interconnect layers are laminated alternately, and said each conductor interconnect layer is connected by a conductive layer arranged in a hole of said insulating layer, and among the insulating layers of said build-up layer of at least one substrate of said first substrate and said second substrate, wherein at least one insulating layer, the average coefficient of thermal expansion along the substrate inplane direction at from 25 degrees centigrade to the glass transition point is 30 ppm/degrees centigrade or less, and the average coefficient of thermal expansion along the substrate thickness direction at from 25 degrees centigrade to the glass transition point is 30 ppm/degrees centigrade or less.

According to the present invention of this structure, among the insulating layers of said build-up layer of at least one of the first substrate and the second substrate, wherein at least one insulating layer, the average coefficient of thermal expansion along the substrate inplane direction at from 25 degrees centigrade to the glass transition point is 30 ppm/degrees centigrade or less, and the average coefficient of thermal expansion along the substrate thickness direction at from 25 degrees centigrade to the glass transition point is 30 ppm/degrees centigrade or less.

Therefore, when the semiconductor device receives a heat history, the warpage of at least the first substrate or the second substrate is reduced. Thereby, it is possible to reduce the occurrence of conductive failure between the first substrate and the first semiconductor chip, or the occurrence of conductive failure between the second substrate and the second semiconductor chip, and to make a semiconductor device with high connection reliability.

In this case, it is preferable that at least one of the insulating layers of said build-up layer contains a cyanate resin. In particular, it is preferable that the cyanate resin is a novolac type cyanate resin.

Thereby, it is possible to surely reduce the coefficient of thermal expansion along the substrate inplane direction of the insulating layers and the coefficient of thermal expansion along the substrate thickness direction.

Further, it is preferable that at least one substrate of said first substrate and said second substrates has a core layer wherein a through-hole provided with a conductive layer is formed in the inside of a insulating layer, and said conductive layer in the through-hole is connected to said conductor interconnect layer of said build-up layer, and the average coefficient of thermal expansion along the substrate inplane direction of said insulating layer of said core layer at from 25 degrees centigrade to the glass transition point is 12 ppm/degrees centigrade or less, and the average coefficient of thermal expansion along the substrate thickness direction of said insulating layer of said core layer at from 25 degrees centigrade to the glass transition point is 20 ppm/degrees centigrade or less.

In particular, it is preferable that the average coefficient of thermal expansion along the substrate inplane direction of said insulating layer of said core layer at from 25 degrees centigrade to the glass transition point is 8 ppm/degrees centigrade or less.

Thereby, it is possible to reduce the warpage of at least the first substrate or the second substrate further more surely.

Furthermore, it is preferable that the resin of said insulating layer of said core layer contains a cyanate resin, and it is still further preferable that it is a novolac type cyanate resin.

Moreover, it is preferable that the resin of all the insulating layers of the built-up layer of said first substrate and the resin of all the insulating layers of the built-up layer of said second substrate contain a cyanate resin, and it is still further preferable that it is a novolac type cyanate resin.

By so doing, it is possible to reduce the warpage of the first substrate and the second substrate surely.

Still further, all the insulating layers of the built-up layer of said first substrate and all the insulating layers of the built-up layer of said second substrate have the average coefficient of thermal expansion along the substrate inplane direction at from 25 degrees centigrade to the glass transition point of 30 ppm/degrees centigrade or less, and the average coefficient of thermal expansion along the substrate thickness direction at from 25 degrees centigrade to the glass transition point of 30 ppm/degrees centigrade or less, and all the insulating layers of the built-up layer of said first substrate and all the insulating layers of the built-up layer of said second substrate may contain a cyanate resin, in particular a novolac type cyanate resin.

Furthermore, it is preferable that a pair of said built-up layers are arranged so as to sandwich said core layer, and the coefficients of thermal expansion of said insulating layers of said build-up layers arranged at an approximately symmetrical position to sandwich said core layer are approximately equal.

By making the coefficients of thermal expansion of the insulating layers of the built-up layers arranged at the approximately symmetrical position to sandwich the core layer approximately equal as above, the warpage of the insulating layers which sandwich the core layer occurs symmetrically. Thereby, it is possible to restrain the occurrence of warpage in the entire substrate.

Herein, the expression that the coefficients of thermal expansion of the insulating layers of the built-up layers are approximately equal means that the difference in the coefficients of thermal expansion between the insulating layers arranged at the symmetrical position to sandwich the core layer is zero or 5 ppm/degrees centigrade or less.

Moreover, it is preferable that said first substrate and said first semiconductor chip are connected with bumps, and an underfill is provided in the circumference of said bumps that connect said first substrate and said first semiconductor chip, and said second substrate and said second semiconductor chip are connected with bumps, and an underfill is provided in the circumference of said bumps that connect said second substrate and said second semiconductor chip, and said respective underfills are made of a resin material whose coefficient of elasticity in atmosphere at 125 degrees centigrade is 150 MPa or more and 800 MPa or less.

By setting the coefficient of elasticity in the atmosphere at 125 degrees centigrade 150 MPa or more, and 800 MPa or less, the circumference of the bump is fixed firmly, and cracking of the bump is prevented.

It is still further preferable the average coefficient of thermal expansion of said respective underfills at from 25 degrees centigrade to the glass transition point is 40 ppm/degrees centigrade or less.

A low dielectric constant film (Low-k layer) is often used as an insulating interlayer in a semiconductor chip. By setting the average coefficient of thermal expansion of the underfills at from 25 degrees centigrade to the glass transition point 40 ppm/or less, it is possible to restrain a damage of the low-k layer.

Further, it is still preferable that said connecting sections are solder bumps.

According to the present invention, it is also possible to provide a semiconductor device comprising a first substrate on which a first semiconductor chip is mounted, a second substrate on which a second semiconductor chip is mounted, and connecting sections that contact the front surface of said first substrate and the back surface of said second substrate, and electrically connect said first substrate and said second substrate, wherein said first substrate has a build-up layer in which insulating layers containing resin and a conductor interconnect layer are laminated alternately, and said each conductor interconnect layer is connected by a conductive layer arranged in a hole of said insulating layer, and among the insulating layers of said build-up layer of said first substrate, wherein at least one insulating layer, the average coefficient of thermal expansion of along the substrate inplane direction at from 25 degrees centigrade to the glass transition point is 35 ppm/degrees centigrade or less, and the average coefficient of thermal expansion along the substrate thickness direction at from 25 degrees centigrade to the glass transition point is 35 ppm/degrees centigrade or less.

According to the present invention, since the average coefficient of thermal expansion along the substrate inplane direction at from 25 degrees centigrade to the glass transition point of one layer of the insulating layers of the built-up layer of the first substrate is 35 ppm/degrees centigrade or less, and the average coefficient of thermal expansion of the one layer of the insulating layers along the substrate thickness direction at from 25 degrees centigrade to the glass transition point is 35 ppm/degrees centigrade or less, and, when the semiconductor device receives a heat history, the warpage of the first substrate can be reduced.

BRIEF DESCRIPTION OF THE DRAWINGS

The object mentioned above and the other objects, features, and advantages of the present invention will become apparent from the detailed description of embodiments and accompanying drawings.

BEST MODE FOR CARRYING OUT THE INVENTION

Figure 1:
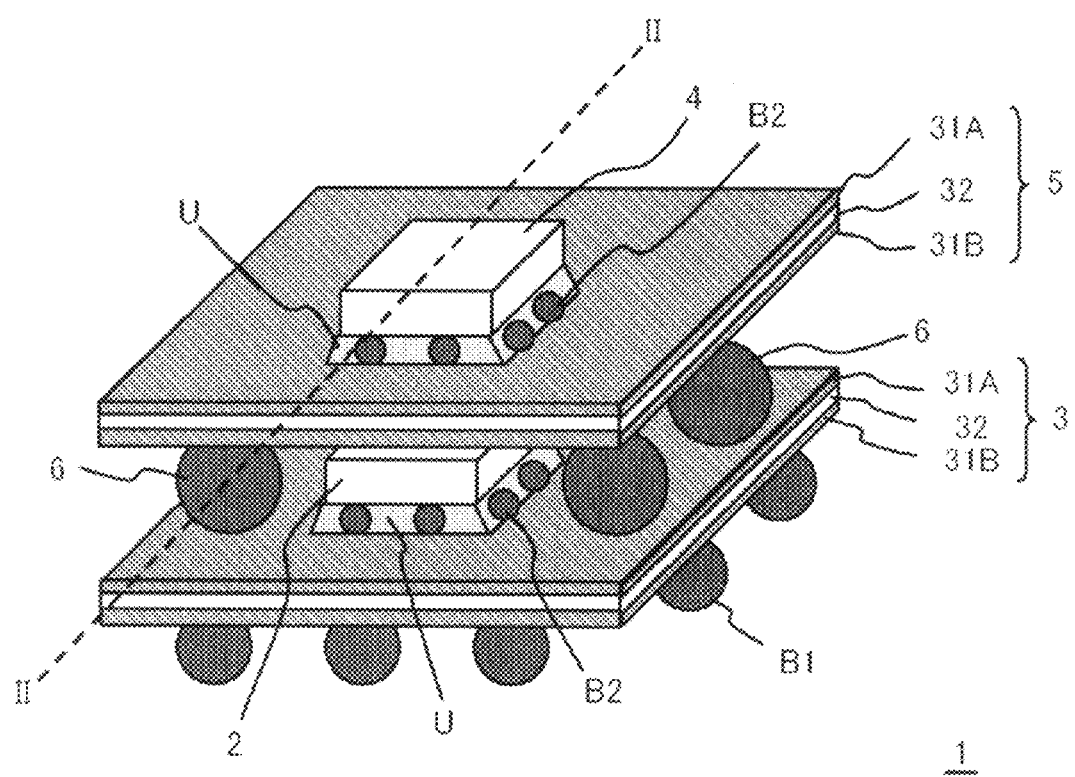
FIG. 1 is a perspective view showing a semiconductor device according to a embodiment of the present invention.

An embodiment according to the present invention is illustrated in more details with reference to the attached drawings hereinafter.

First, with reference to FIG. 1 through FIG. 5, the outline of a semiconductor device 1 according to the present embodiment is explained.

The semiconductor device 1 of the present embodiment includes a first substrate 3 on which a first semiconductor chip 2 is mounted, a second substrate 5 on which a second semiconductor chip 4 is mounted, and connecting sections 6 that contact the front surface of the first substrate 3 and the back surface of the second substrate 5, and electrically connect the first substrate 3 and the second substrate 5.

The first substrate 3 has build-up layers 31A and 31B in each of which insulating layers 311 containing resin, conductor interconnect layers 312, and a conductor interconnect layer 313 are laminated alternately, and each conductor interconnect layers 312, 313 are connected by a conductive layer 314 formed in a hole (via hole (through-hole)) of the insulating layer 311.

Further, the second substrate 5 has build-up layers 31A, 31B in each of which insulating layers 311 containing a resin, conductor interconnect layers 312, and a conductor interconnect layer 313 are laminated alternately, and each conductor interconnect layers 312, 313 are connected by a conductive layer 314 formed in a hole (via hole (through-hole)) of the insulating layer 311.

Among the insulating layers 311 of the build-up layers in at least one substrate of the first substrate 3 and the second substrate 5, in at least the one insulating layer 311, the average coefficient of thermal expansion along the substrate inplane direction at from 25 degrees centigrade to the glass transition point is 35 ppm/degrees centigrade or less, preferably, 30 ppm/degrees centigrade or less, and the average coefficient of thermal expansion along the substrate thickness direction at from 25 degrees centigrade to the glass transition point is 35 ppm/degrees centigrade or less, preferably, 30 ppm/degrees centigrade or less.

The structure of the semiconductor device 1 is explained in detail hereinafter.

[First Substrate]

First, the first substrate 3 is explained.

The first substrate 3 is the substrate on whose surface the first semiconductor chip 2 is mounted.

Figure 3:
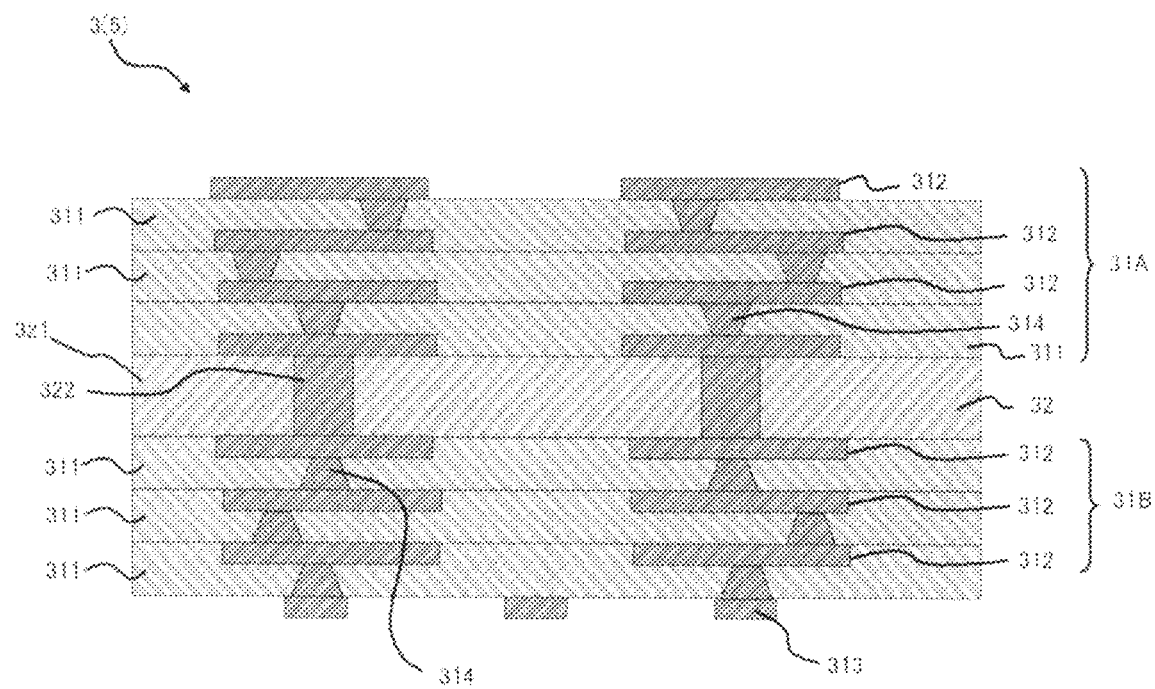
FIG. 3 is a cross sectional view of a first substrate of a semiconductor device.

As shown in FIG. 3, the first substrate 3 is equipped with a core layer 32 and a pair of built-up layers 31A, 31B arranged to sandwich this core layer 32.

The built-up layer 31A is arranged to the front surface side of the core layer 32, and an insulating layer 311 containing a resin and a conductor interconnect layer 312 are laminated alternately therein.

In the present embodiment, in the built-up layer 31A, a plurality (for example, three layers) of the insulating layers 311 and a plurality (for example, four layers) of the conductor interconnect layers 312 are laminated alternately.

The insulating layer 311 is not a prepreg made by impregnating various resins into woven fabrics of carbon fibers, glass fibers or fibers pulled and arranged in one direction, but is made of only a resin composition. That is, the insulating layer 311 is a layer that is not reinforced by fibers such as carbon fibers, glass fibers, and the like.

Herein, as the resin that composes the insulating layer 311, an epoxy resin, a BT resin, a cyanate resin, and the like may be listed up. In particular, a bisphenol A type cyanate resin, a bisphenol E type cyanate resin, a tetra-methyl bisphenol F type cyanate resin, and the like are listed. In particular, it is preferable to use a novolac type cyanate resin.

As the novolac type cyanate resin, resins expressed by the following chemical formula may be used. In the formula, n denotes a positive number.

[Chemical Formula 1]

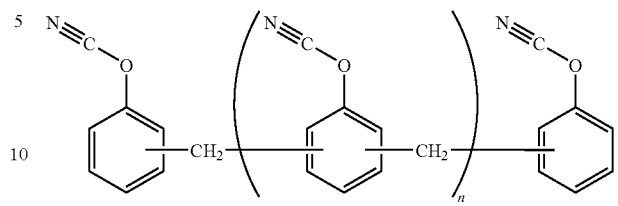

Formula 1

Such a novolac type cyanate resin may be obtained, for example, by reacting novolac type phenol with compounds such as cyanogen chloride and cyanogen bromide.

Further, it is preferable that the weight average molecular weight of a novolac type cyanate resin is, for example, 500 through 4500. Furthermore, it is preferable that it is 600 through 3000.

In the case when the weight average molecular weight is less than 500, the mechanical strength may be lowered. Moreover, if the weight average molecular weight exceeds 4500, the cure rate of the resin composition become fast, and its storage stability may be lowered.

Moreover, a prepolymer of a cyanate resin may be used as the cyanate resin. The cyanate resin, and the prepolymer may be used independently, and the cyanate resin and prepolymer may be used together. Herein, a prepolymer is usually obtained by, for example, trimerizing a cyanate resin by a heating reaction or the like. In particular as the prepolymer, although not limited, for example, one whose trimerization ratio is 20 through 50% by weight may be used. This trimerization ratio may be obtained by use of, for example, an infrared spectroscopic analyzer.

Further, an epoxy resin, a phenoxy resin, and the like may be added to the cyanate resin. As the epoxy resin, one having a biphenyl alkylene framework is preferable.

In the present embodiment, each insulating layer 311 is composed of the same kind of material, and the average coefficients of thermal expansion along the substrate inplane direction at from 25 degrees centigrade to the glass transition point of each insulating layer 311 is 35 ppm/degrees centigrade or less, preferably, 30 ppm/degrees centigrade or less, and the average coefficients of thermal expansion along the substrate thickness direction is 35 ppm/degrees centigrade or less, preferably, 30 ppm/degrees centigrade.

Herein, in the insulating layer 311, the average coefficient of thermal expansion along the substrate inplane direction at from 25 degrees centigrade to the glass transition point is, in particular preferably, 20 ppm/degrees centigrade or less, and the average coefficient of thermal expansion along the substrate thickness direction is, in particular preferably, 20 ppm/degrees centigrade or less.

Furthermore, in the insulating layer 311, the average coefficient of thermal expansion along the substrate inplane direction at from 25 degrees centigrade to the glass transition point is preferably 3 ppm/degrees centigrade or more, and the average coefficient of thermal expansion along the substrate thickness direction is preferably 3 ppm/degrees centigrade or more.

In the present embodiment, in each insulating layer 311, the average coefficient of thermal expansion along the substrate inplane direction and the average coefficient of thermal expansion along the substrate thickness direction are approximately the same.

In addition, the average coefficient of thermal expansion of the insulating layer 311 can be measured as follows.

A 5 mm×5 mm sized sample is cut out from a film of the resin composition that composes the insulating layer 311, and by use of TMA (manufactured by TA Instruments), the sample is heated up from room temperature (25 degrees centigrade) at 5 degrees centigrade/minute and the amounts of displacement along the thickness direction of the sample and along the inplane direction of the sample are measured, and the coefficients of thermal expansion along the thickness direction and along the inplane direction are calculated. And, the coefficients of thermal expansion along the thickness direction and along the inplane direction at from 25 degrees centigrade to the glass transition point are calculated.

Moreover, it is preferable that the insulating layer 311 has a high glass transition point. For example, it is preferable that the glass transition point of the insulating layer 311 is 160 degrees centigrade or more, and it is further preferable that it is 180 degrees centigrade or more. Further, it is preferable that it is 300 degrees centigrade or less.

The glass transition point Tg of the insulating layer 311 is measured in conformity with ISO-11359-2. A 5 mm×5 mm sized sample is cut out from a film of the resin composition that composes the insulating layer 311, and the probe of TMA equipment (manufactured by TA Instruments) is put on this sample, and the sample is heated up from room temperature (25 degrees centigrade) at 5 degrees centigrade/minute and the amount of displacement along the thickness direction of the sample is measured. And, the tangent lines of the curves before and after the glass transition point of the curves showing the temperature and the amount of displacement of the thickness of the sample are taken, and the glass transition point is calculated from the intersection of the tangent lines.

A via hole is formed in such an insulating layer 311, and a conductive layer 314 is provided in the via hole. The conductive layer 314 is to connect the conductor interconnect layers 312 arranged above and below to sandwich the insulating layer 311.

Figure 4:
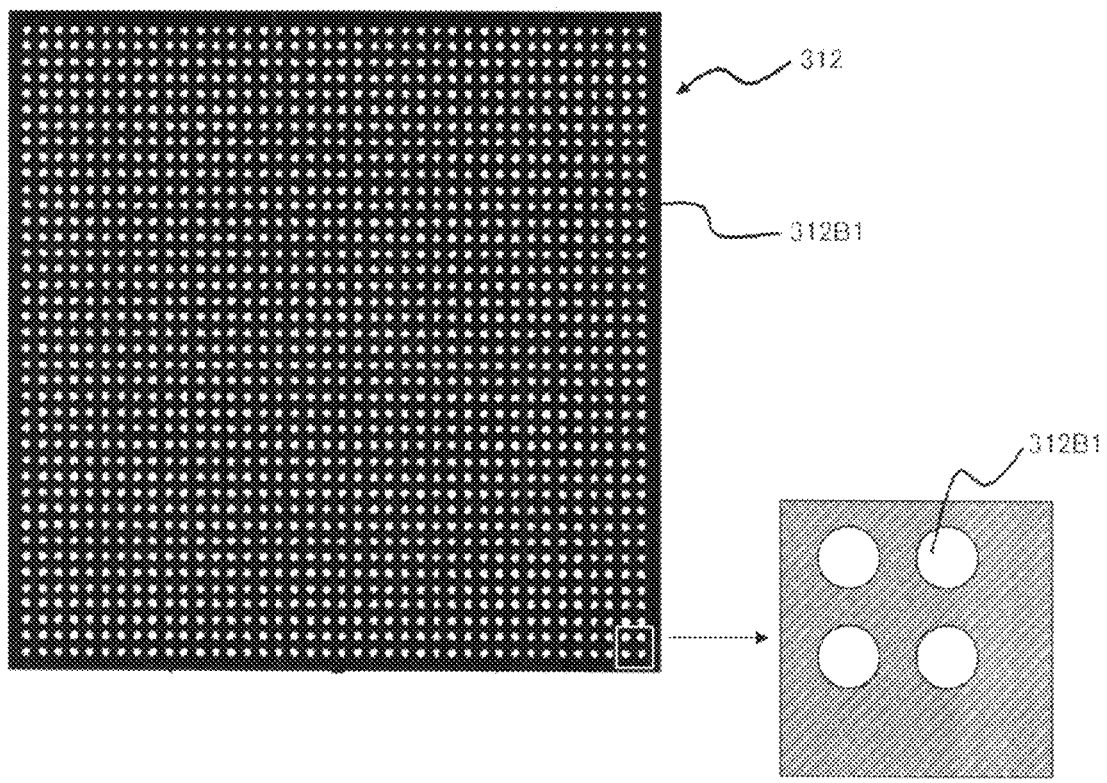
FIG. 4 is a plane view showing a conductor interconnect layer.

The conductor interconnect layer 312 is a metal layer, and is, for example, a copper interconnect layer. The planar shape of this conductor interconnect layer 312 is a form as shown in FIG. 4, and a plurality of approximately circular openings 312B1 are formed therein. Meanwhile, the figure at the lower right of FIG. 4 is an enlarged view of the conductor interconnect layer 312.

The diameter of the opening 312B1 is, for example, 500 micrometers. And, the remaining copper ratio of this conductor interconnect layer 312 is 60 through 90%, and preferably, 75 through 85%.

Herein, a pair of conductor interconnect layers 312 arranged to sandwich the insulating layer 311 are connected by a conductive layer 314 made of a metal (for example, copper) provided in the via hole of the insulating layer 311.

The built-up layer 31B is arranged at the back surface side of the core layer 32, and is equipped with insulating layers 311, conductor interconnect layers 312 and a conductor interconnect layer 313 in the same manner as the built-up layer 31A.

The insulating layer 311 and the conductor interconnect layers (312, 313) are arranged alternately.

Herein, a plurality (for example, three layers) of the insulating layers 311 are provided, and a plurality (for example, three layers) of the conductor interconnect layers 312 are provided. In addition, the conductor interconnect layer 313 is composed of one layer, and it is arranged at the lowest layer of the built-up layer 31B.

Figure 5:
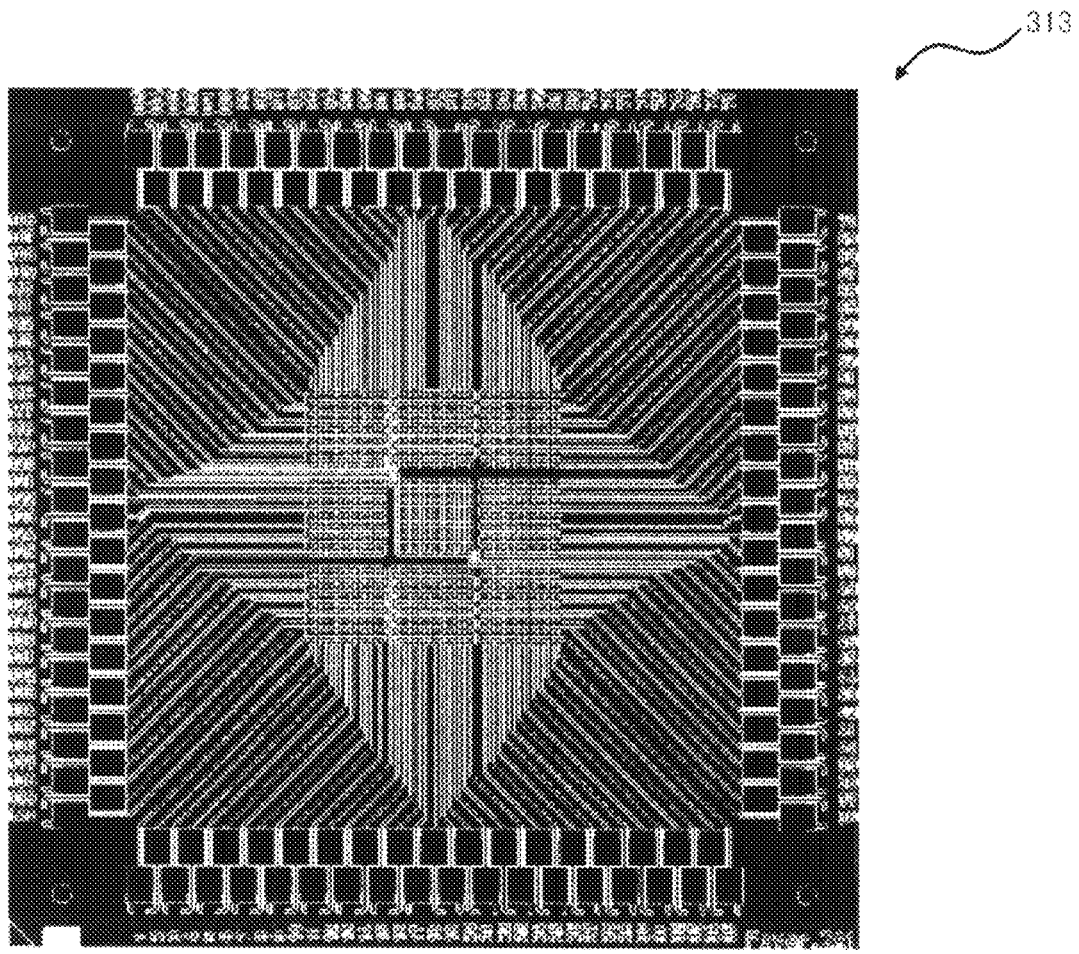
FIG. 5 is a plane view showing a conductor interconnect layer.

The conductor interconnect layer 313 is, for example, a copper interconnect layer, and has such a structure as shown in FIG. 5. In FIG. 5, the black portion shows the copper interconnect.

The remaining copper ratio (the ratio occupied by the conductor interconnect layer 313 which covers the insulating layer) of this conductor interconnect layer 313 is 80%.

Again, as shown in FIG. 3, the core layer 32 has the insulating layer 321. The insulating layer 321 is obtained by piling a specified number of prepreg sheets and heating and pressing them into the layer shape.

The prepreg is made by impregnating resin varnish into woven fabrics of glass fibers and the like.

As the resin that composes the insulating layer 321, the same one as the resin that composes the insulating layer 311 of the built-up layer may be used. It is preferable that the insulating layer 321 includes a cyanate resin, and it is in particular preferable that it includes a novolac type cyanate resin.

Moreover, in the insulating layer 321, it is preferable that the average coefficient of thermal expansion along the substrate inplane direction at from 25 degrees centigrade to the glass transition point is 12 ppm/degrees centigrade or less, and, the average coefficient of thermal expansion along the substrate thickness direction at from 25 degrees centigrade to the glass transition point is 20 ppm/degrees centigrade or less.

Further preferably, in the insulating layer 321, the average coefficient of thermal expansion along the substrate inplane direction at from 25 degrees centigrade to the glass transition point is 11 ppm/degrees centigrade or less, still further preferably 8 ppm or less, and the average coefficient of thermal expansion along the substrate thickness direction at from 25 degrees centigrade to the glass transition point is 16 ppm/degrees centigrade or less, still further preferably 12 ppm or less.

Furthermore, in the insulating layer 321, the average coefficient of thermal expansion along the substrate inplane direction at from 25 degrees centigrade to the glass transition point is preferably 3 ppm/degrees centigrade or more, and the average coefficient of thermal expansion along the substrate thickness direction is preferably 3 ppm/degrees centigrade or more.

The average coefficient of thermal expansion of the insulating layer 321 may be measured by the same method as the measurement method of the average coefficient of thermal expansion of the insulating layer 311. That is, a 5 mm×5 mm sized sample is cut out from the film that composes the insulating layer 321, and it is measured by use of TMA (manufactured by TA Instruments).

A through-hole (through bore) is formed in such an insulating layer 321 of the core layer 32, and the conductive layer 322 is provided in the through-hole. The conductive layer 322 is a metal layer (for example, a copper layer), and it is connected to the conductor interconnect layer 312 of the built-up layer 31A, and also connected to the conductor interconnect layer 312 of the built-up layer 31B.

Herein, the fiber base material including layer (insulating layer 321) used for the core layer 32 is explained.

The fiber base material including layer used for the core layer 32 is a layer made by impregnating the resin material that composes the core layer 32 into fiber base materials, and by having this, it is possible to attain low linear expansion, and high elasticity of the core layer 32.

It is preferable that the fiber base materials used for a fiber base material including layer are selected from glass fiber base materials and organic fiber base materials. By disposing the above fiber base materials between resin layers, it is possible to prevent the warpage of the first substrate.

As the glass fiber base materials, glass woven fabrics, glass unwoven fabrics, and the like may be listed up. Among them, glass woven fabrics are in particular preferable. Moreover, the glass fiber base materials may be materials whose surface is processed by a coupling agent in order to improve adhesiveness. For example, there are amino silane coupling processing, vinyl silane coupling processing, cationic silane coupling processing, and the like, meanwhile, epoxy silane coupling processing is more suitable for impregnating the resin composition that composes the core layer into glass fiber base materials.

By using the glass fiber base materials processed by the epoxy silane coupling agent, it is possible to improve adhesiveness with a cyanate resin.

As organic fiber base materials, organic nonwoven fabrics, organic woven fabrics, and the like may be listed up. By use of these, it is possible to make the laser processing property excellent. For example, fibers made of polyethylene, polypropylene, vinylon, polyvinyl chloride, polyvinylidene chloride, polyacrylonitrile, polyamide, polyester, polyurethane and the like, modified materials thereof or mixtures thereof, polyamide type resin fibers such as a poly benzoxazole resin fiber, a polyamide resin fiber, an aromatic polyamide resin fiber, a wholly aromatic polyamide resin fiber and the like, polyester type resin fibers such as a polyester resin fiber, aromatic polyester type resin fibers, liquid crystal polyester, a wholly aromatic polyester resin fiber and the like, synthetic fiber base materials composed mainly of such as a polyimide resin fiber, a fluoro resin fiber and the like, organic fiber base materials such as paper base materials and the like made mainly of a craft paper, a cotton linter paper and a mixed paper of linter and craft pulp and the like, and so forth may be listed up. In particular, from the viewpoint of moisture resistance, liquid crystal polyester is preferable.

Among the above fiber base materials, it is preferable to use a glass fiber base material. In particular, it is preferable to use a glass fiber base material whose coefficient of thermal expansion (CTE: Coefficient of Thermal Expansion) is 6 ppm or less, and it is further preferable to use a glass fiber base material whose coefficient of thermal expansion is 3.5 ppm or less. By use of the glass fiber base material having the above coefficients of thermal expansion, it is possible to restrain the warpage of the substrate more effectively.

It is preferable that the basis weight (weight of the fiber base materials per 1 $m^2$) of the glass fiber base material is 4 through 24 $g/m^2$, further preferably 8 through 20 $g/m^2$, and still further preferably 12 through 18 $g/m^2$.

Further, it is preferable that the Young's modulus of the glass fiber base material is 62 through 100 GPa, and further preferably 65 through 92 GPa, and still further preferably 86 through 92 GPa. When the Young's modulus of the glass fiber base material is in the above range, it is possible to effectively control the deformation of the substrate due to, for example, the reflow heat at the moment of connecting the semiconductor chip, and consequently, the connection reliability of the semiconductor chip is improved.

Furthermore, as for the glass fiber base material, it is preferable that the dielectric constant at 1 MHz is 3.8 through 11.1, further preferably 4.7 through 7.0, and still further preferably 5.4 through 6.8. When the dielectric constant of the glass fiber base material is in the above range, it is possible to reduce the dielectric constant of the core layer, which is suitable for the semiconductor package using high-speed signals.

As the glass fiber base material that has the above coefficient of thermal expansion, Young's modulus, and dielectric constant, for example, E glass, S glass, NE glass, T glass, and the like may be suitably used.

It is preferable that the thickness of the fiber base material is 5 through 35 micrometers, and further preferably 10 through 20 micrometers, and still further preferably 14 though 15 micrometers. Moreover, the number of sheets of the fiber base material used is not limited to only one sheet, but a plurality of sheets of thin fiber base material may be used in piles. Meanwhile, when the plurality of sheets of the fiber base material are used in piles, the total thickness thereof have only to be in the above range.

It is preferable to use a glass nonwoven fabric, a glass woven fabric whose thickness is in particular 10 through 15 micrometers and whose basis weight is 8 through 18 $g/m^2$. By use of such a glass nonwoven fabric and a glass woven fabric, it is possible to prevent the warpage of the first substrate further effectively.

Figure 2:
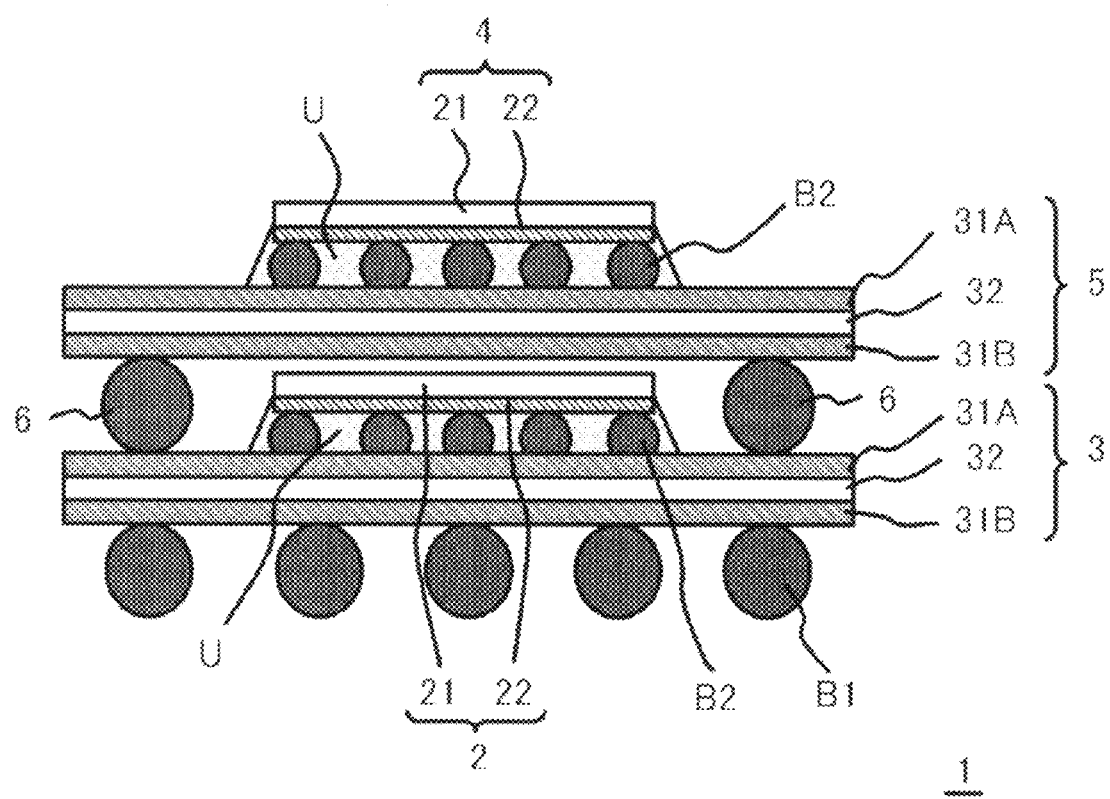
FIG. 2 is a cross sectional view at II-II in FIG. 1.

In the back surface of such a first substrate 3, as shown in FIGS. 1 and 2, a solder bump B1 is provided. This solder bump B1 is connected to the conductor interconnect layer 313 of the built-up layer 31B of the first substrate 3.

As the solder bump B1, for example, Pb free solder and the like may be listed up. In the present embodiment, tin-silver solder is employed. The bump constituent material is not limited to this, but for example, tin-bismuth solder, tin-zinc solder and the like may be used too. Moreover, as the solder bump B1, solder bumps containing Pb (for example, Sn/95Pb, Sn/63Pb and the like) may be employed. As the solder bump B2, for example, one whose coefficient of thermal expansion is 10 ppm/degrees centigrade or more, and 25 ppm/degrees centigrade or less may be employed.

[First Semiconductor Chip]

The first semiconductor chip 2 is equipped with a interconnect layer 22 which consists of so-called a low-k layer on a silicon substrate 21, as shown in FIG. 2. The function thereof is not particularly limited, but a logic device, a memory device, or a mixture of these and the like may be listed up.

The low-k layer is provided as an interlayer dielectric. Herein, the low-k layer means a film whose specific dielectric constant is 3.3 or less. As the low-k layer, for example, organic films such as SiOC, MSQ (methyl silsesquioxane), and benzocyclobutene and the like, and inorganic films such as HSQ (hydroxy silsesquioxane) and the like, are listed up, and a porused layer thereof is also used preferably.

Such a first semiconductor chip 2 is mounted in a approximately central portion of the surface of the first substrate 3.

Between the first semiconductor chip 2 and the first substrate 3, a plurality of solder bumps B2 are arranged, and the first semiconductor chip 2 and the first substrate 3 are connected with each other by the solder bumps B2.

As the solder bump B2, for example, Pb free solder and the like are listed up. In the present embodiment, tin-silver solder is used. The constituent material of the bump B2 is not limited to this, but for example, tin-bismuth solder, tin-zinc solder, and the like may be employed. Moreover, as the solder bumps B2, solder bumps containing Pb (for example, Sn/95Pb, Sn/63Pb, and the like) may be also employed. As the solder bump B2, for example, one whose coefficient of thermal expansion is 10 ppm/degrees centigrade or more, and 25 ppm/degrees centigrade or less, may be used.

In the circumference of such solder bumps B2, underfill U is filled up.

[Second Substrate]

The second substrate 5 is composed of the same substrate material as the first substrate 3 in the present embodiment, and has the same layer structure as the first substrate 3. That is, the second substrate 5 is equipped with the same built-up layers 31A and 31B, and the core layer 32 as the first substrate 3.

In the present embodiment, although the second substrate 5 is the same member as the first substrate 3, in order to distinguish that from the first substrate 3, the reference number of the second substrate will be 5.

[Second Semiconductor Chip]

The second semiconductor chip 4 is mounted on the surface of the second substrate 5. This second semiconductor chip 4 may be one equipped with the interconnect layer 22 made of so-called a low-k layer, on the silicon substrate 21, in the same manner as the first semiconductor chip 2, or it may not have the low-k layer, but have an $SiO_2$ layer. The first semiconductor chip may be configured to have a logic circuit, and the second semiconductor chip may be configured to have a memory device.

Between the second semiconductor chip 4 and the second substrate 5, the same solder bump B2 as the solder bumps that connect the first semiconductor chip 2 and the first substrate 3 are provided. This solder bump B2 electrically connects the conductor interconnect layer 312 of the built-up layer 31A of the second substrate 5, and the second semiconductor chip 4.

In addition, the second semiconductor chip 4 and the second substrate 5 may be connected by a wire instead of the solder bump B2.

[Underfill]

The underfill U is filled in the circumference of the solder bumps B2 that connect the first substrate 3 and the first semiconductor chip 2, and the circumference of the solder bumps B2 that connect the second substrate 5 and the second semiconductor chip 4 respectively.

As the constituent material of the underfill U, a fluid thermosetting resin and a film shaped thermosetting resin may be used. Among these, a fluid thermosetting resin is preferable. This is because the gap between the first substrate 3 and the first semiconductor chip 2 and the gap between the second substrate 5 and the second semiconductor chip 4 can be filled up with it efficiently. In the present embodiment, the underfill U is composed of a resin material whose coefficient of elasticity is 150 MPa or more and 800 MPa or less under 125 degrees centigrade atmosphere.

In particular, as the underfill U, it is further preferable to use one whose coefficient of elasticity is 200 MPa or more under 125 degrees centigrade atmosphere, further, it is preferable to use one whose coefficient of elasticity is 600 or less MPa under 125 degrees centigrade atmosphere.

The measurement method of the coefficient of elasticity is as follows. After paste of underfill U is formed into 10 mm in width and approximately 150 mm in length and 4 mm in thickness, and cured in an oven for 30 minutes at 200 degrees centigrade, the coefficient of elasticity is calculated from the initial slope of the stress-strain curve obtained by measurement by a tension tester at the speed of 1 mm/minute under 125 degrees centigrade atmosphere.

As the resin material used for the underfill U, various materials may be used. For example, an epoxy resin, a BT resin, a cyanate resin, and the like may also be used. As a cyanate resin, the novolac type cyanate resin described in the section of substrate material is used preferably.

It is preferable that the resin material that composes the underfill U includes a multifunctional epoxy resin. Thereby, the crosslinking density of the resin cured body can be improved, and a high coefficient of elasticity can be realized.

The underfill U may contain inorganic fillers such as silica particles and the like. By so doing, it is possible to reduce the coefficient of thermal expansion, and reduce damages of the semiconductor chips 2 and 4, and damages between the first semiconductor chip 2 and the first substrate 3, and damages between the second semiconductor chip 4, and the second substrate 5 further effectively.

The underfill U may also include a coupling agent. By so doing, it is possible to improve the adhesiveness of bumps and inorganic fillers with underfill, and reduce the coefficient of thermal expansion, and reduce damages of semiconductor chips, and damages between semiconductor chips and the substrate 3 still further effectively. As the coupling agent, silane coupling agents such as epoxy silane, amino silane and the like, and titanate type coupling agents and the like may be used. Plural kinds of these may be employed. The coupling agent may be in a form dispersed in the binder portion of the underfill, and may be in a form adhering to the surface of inorganic fillers such as silica particles and the like. Or, these forms may be intermingled. For example, when silica particles are mixed, the silica surface may be processed by the coupling agent beforehand.

It is preferable that the average coefficient of thermal expansion of the underfill U at from 25 degrees centigrade to the glass transition point is 40 ppm/degrees centigrade or less, and further preferably 30 ppm/degrees centigrade or less, and in particular preferably 25 ppm/degrees centigrade or less. It is possible to control the damage of the low-k layer and to control the damage around the circumference of the bumps B2 further more effectively.

Moreover, it is preferable that the average coefficient of thermal expansion of the underfill U at from 25 degrees centigrade to the glass transition point is 1 ppm/degrees centigrade or more, and further preferably 3 ppm/degrees centigrade or more.

In addition, the average coefficient of thermal expansion of the underfill U at from 25 degrees centigrade to the glass transition point can be measured as follows.

After a liquefied pouring sealing underfill material is cured at 150 degrees centigrade for 120 minutes, a 5×5×10 mm sized sample piece is obtained by cutting. This sample piece is measured under conditions of compressive load 5 g, and heating rate 10 degrees centigrade/minute by use of a TMA/SS120 manufactured by SEIKO.

[Connecting Section]

The connecting sections 6 contact the conductor interconnect layer 312 of the front surface of the first substrate 3 and the conductor interconnect layer 313 of the back surface of the second substrate 5, and electrically connect the first substrate 3 and the second substrate 5.

In the present embodiment, the connecting sections 6 are solder bumps made of Pb free solder and the like.

Plural connecting sections 6 are arranged so as to surround the first semiconductor chip 2 on the first substrate 3. In other words, the first semiconductor chip 2 is arranged at the void portion formed by the connecting sections 6, the first substrate 3, and the second substrate 5.

The height dimension of the connecting sections 6 is larger than the total value of the thickness dimension of the first semiconductor chip 2, and the thickness dimension of the solder bumps B2, and a gap is formed between the front surface of the first semiconductor chip 2, and the back surface of the second substrate 5.

Next, the method of manufacturing the above semiconductor devices 1 is explained hereinafter.

First, a first substrate 3 and a second substrate 5 are prepared.

The method of manufacturing the first substrate 3 is described.

Meanwhile, the method of manufacturing the second substrate 5 is the same as the method of manufacturing the first substrate 3.

First, a double-sided copper clad laminate plate (a plate where copper layers are formed in the back and front surfaces of the insulating layer 321 of the core layer 32) is prepared, and a through-hole is formed in a specified position, and the conductive layer 322 is formed.

Next, the conductor interconnect layer 312 is formed in the back and front surfaces of the insulating layer 321 respectively by the subtractive method. Thereafter, the surfaces of a pair of conductor interconnect layers 312 are made coarse with a reagent fluid, and the insulating layers 311 are laminated respectively.

Furthermore, a via hole is formed in the insulating layers 311 by laser processing or the like. Thereafter, the conductor interconnect layers 314 are formed in the via hole, and further the conductor interconnect layers 312 are formed on each insulating layers 311 by the semi additive construction method.

The first substrate 3 can be obtained by repeating such operations. In addition, the conductor interconnect layer at the lowest layer of the first substrate 3 is named as the conductor interconnect layer 313.

Next, the first semiconductor chip 2 and the second semiconductor chip 4 are implemented onto thus obtained the first substrate 3 and the second substrate 5 respectively.

The solder bumps B2 are provided in the back surfaces of the first semiconductor chip 2 and the second semiconductor chip 4, and the first semiconductor chip 2 and the second semiconductor chip 4 are provided onto the first substrate 3 and the second substrate 5 respectively, and the solder bumps B2 are melted in a reflow furnace, and thereby the first semiconductor chip 2 and the second semiconductor chip 4 are fixed onto the first substrate 3 and the second substrate 5 respectively.

Thereafter, the circumference of the solder bump B2 that connects the first substrate 3 and the first semiconductor chip 2, and the circumference of the solder bump B2 that connects the second substrate 5 and the second semiconductor chip 4 are filled up with the underfill U respectively.

Next, the solder bump that composes the connecting section 6 is provided in the back surface of the second substrate 5, and the second substrate 5 and the first substrate 3 are connected by this connecting sections 6.

Further, the solder bump B1 is provided in the back surface of the first substrate 3, and thereby the semiconductor device 1 can be obtained.

Such a semiconductor device 1 is implemented on a printed interconnect board via the solder bump B1 of the back surface of the first substrate 3.

Next, the function and effect of the present embodiment is explained hereinafter.

In the present embodiment, in each insulating layers 311 of the built-up layers 31A and 31B that compose each substrates of the first substrate 3 and the second substrate 5 of the semiconductor device 1, the average coefficient of thermal expansion along the substrate inplane direction at from 25 degrees centigrade to the glass transition point is 35 ppm/degrees centigrade or less, preferably 30 ppm/or less, and the average coefficients of thermal expansion of the substrate thickness direction is 35 ppm/degrees centigrade or less, preferably 30 ppm/degrees centigrade or less.

Thereby, it is possible to reduce the amounts of deformation along the substrate inplane direction, and the substrate thickness direction of the built-up layers 31A and 31B at the time when the semiconductor device 1 receives a heat history. Accordingly, the warpage of the first substrate 3 and the second substrate 5 is reduced.

Therefore, it is possible to reduce the occurrence of conductive failure between the first substrate 3 and the first semiconductor chip 2, and the occurrence of conductive failure between the second substrate 5 and the second semiconductor chip 4, and it is possible to obtain the semiconductor device 1 with high connection reliability.

Moreover, the insulating layer 311 of the built-up layer 31A of the first substrate 3, and the insulating layer 311 of the built-up layer 31A of the second substrate 5 are arranged much close to the solder bumps B2, and when the solder bumps B2 are melted, they are liable to be affected by heat. Therefore, the warpage of the substrates 3 and 5 that is occurred when the solder bumps B2 are melted can also be reduced, and it is possible to make the semiconductor device 1 with high connection reliability.

Furthermore, by making the insulating layer 311 to include a cyanate resin, in particular a novolac type cyanate resin, it is possible to reduce the warpage of the first substrate 3 and the second substrate 5 further more surely.

Moreover, in the present embodiment, in the insulating layers 321 of each core layers 32 of the first substrate 3 and the second substrate 5, the average coefficient of thermal expansion along the substrate inplane direction at from 25 degrees centigrade to the glass transition point is set to 12 ppm/degrees centigrade or less, and the average coefficient of thermal expansion along the substrate thickness direction is set to 20 ppm/degrees centigrade or less.

Thereby, it is possible to reduce the amounts of deformation along the substrate inplane direction and the substrate thickness direction of the core layer 32 at the moment when the first substrate 3 and the second substrate 5 receive a heat history, and it is possible to reduce the occurrence of the warpage of the first substrate 3 and the second substrate 5 further more surely.

Moreover, by making the insulating layers 321 of each core layers 32 of the first substrate 3 and the second substrate 5 to include a cyanate resin, in particular a novolac type cyanate resin, it is possible to reduce the occurrence of the warpage of the first substrate 3 and the second substrate 5 still further more surely.

Further, in the present embodiment, since the coefficient of elasticity of the underfill U is set to 150 MPa or more, and 800 MPa or less, and accordingly, the circumference of the bumps B2 is fixed firmly, and the crack of bumps B2 is prevented.

Moreover, the low dielectric constant film (Low-k layer) is used to the first semiconductor chip 2 and the second semiconductor chip 4 as an insulating interlayer. By making the average coefficient of thermal expansion of the underfill U at from 25 degrees centigrade to the glass transition point 40 ppm/degrees centigrade or less, it is possible to reduce the amount of deformation of the underfill U at the time of receiving a heat history, and it is possible to restrain the damage of the low-k layer of the first semiconductor chip 2 and the second semiconductor chip 4.

In recent years, the improvement in the operation capability and high-speed processing of devices have been progressing, and it becomes difficult to be coped by the conventional $SiO_2$ insulation film. Therefore, from the viewpoint of parasitic capacitance reduction between interconnects, low dielectric constant films, in particular porous low dielectric constant films are preferably used as the insulating interlayer. However, the low-k layer whose specific dielectric constant is 3.3 or less is fragiled, and when a semiconductor chip having the low-k layer is implemented with face down, conductive failure and semiconductor chip cracks may occur. In the low-k layer whose specific dielectric constant is 2.7 or less, it is necessary to make it porous, and vulnerability of the low-k layer further progresses. Therefore, it is considered to be especially useful to make the average coefficient of thermal expansion of the underfill U at from 25 degrees centigrade to the glass transition point 40 ppm/degrees centigrade or less, as in the present embodiment.

In addition, the present invention is not limited to the said embodiment, but deformation, improvement, and the like in the range to attain the object of the present invention are included in the present invention.

For example, in the said embodiment, all the insulating layers 311 of the built-up layers 31A and 31B of the first substrate 3 have the average coefficient of thermal expansion along the substrate inplane direction at from 25 degrees centigrade to the glass transition point of 35 ppm/degrees centigrade or less, and the average coefficient of thermal expansion along the substrate thickness direction of 35 ppm/degrees centigrade or less, however, the present invention is not limited to this.

Figure 6:
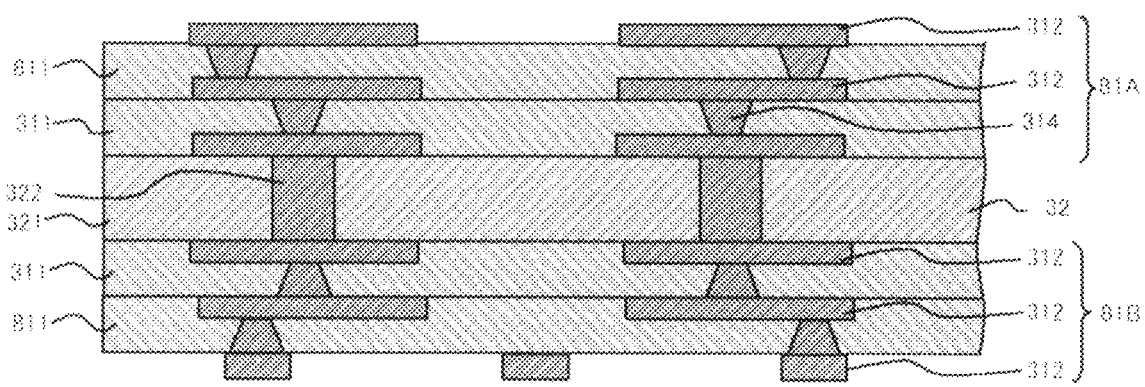
FIG. 6 is a cross sectional view showing a first substrate according to a modified embodiment of the present invention.
Figure 7:
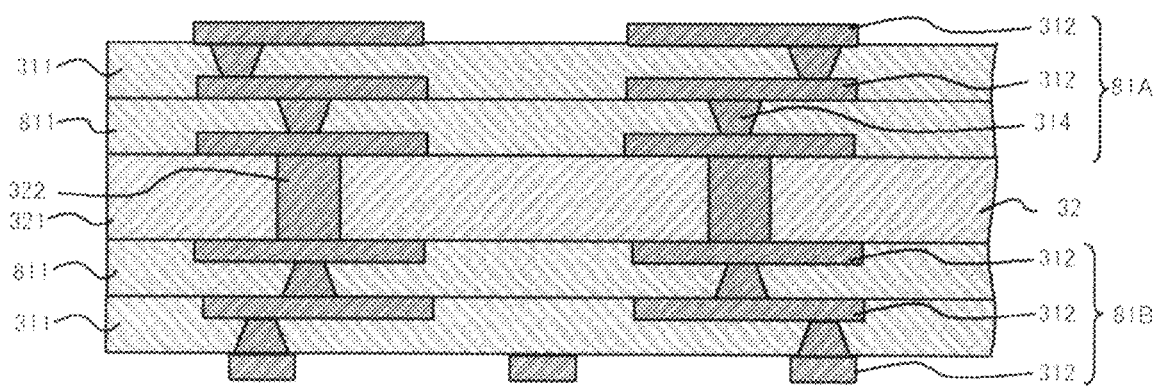
FIG. 7 is a cross sectional view showing a first substrate according to a modified embodiment of the present invention.

For example, as shown in FIG. 6 and FIG. 7, each built-up layers 81A and 81B may be configured to have the insulating layers 311 whose average coefficient of thermal expansion along the substrate inplane direction at from 25 degrees centigrade to the glass transition point is 30 ppm/degrees centigrade or less, and whose average coefficient of thermal expansion along the substrate thickness direction is 30 ppm/degrees centigrade or less, and the insulating layer 811 whose average coefficient of thermal expansion along the substrate inplane direction at from 25 degrees centigrade to the glass transition point exceeds 30 ppm/degrees centigrade (for example, 60 ppm/degrees centigrade), and whose average coefficient of thermal expansion along the substrate thickness direction exceeds 30 ppm/degrees centigrade (for example, 60 ppm/degrees centigrade).

In this case, it is preferable that the coefficient of thermal expansion of the insulating layers 311 and 811 arranged in approximately symmetrical positions sandwiching the core layer 32 are equal.

Thus, by making equal the coefficients of thermal expansion of the insulating layers arranged in approximately symmetrical positions sandwiching the core layer 32, the warpage of the insulating layers which sandwich the core layer 32 occurs symmetrically. Thereby, it is possible to restrain the occurrence of the warpage in the entire substrate.

Also in the second substrate, the same layer structure as those shown in FIG. 6 and FIG. 7 may be used.

Moreover, in the said embodiment, in the insulating layers 311 of the first substrate 3 and the second substrate 5, although the average coefficient of thermal expansion along the substrate inplane direction at from 25 degrees centigrade to the glass transition point is set to 3.5 ppm/degrees centigrade or less, and the average coefficient of thermal expansion along the substrate thickness direction is set to 35 ppm/degrees centigrade or less, there is no problem if at least one insulating layer of at least one substrate has the average coefficients of thermal expansion along the substrate inplane direction at from 25 degrees centigrade to the glass transition point of 35 ppm/degrees centigrade or less, preferably 30 ppm/degrees centigrade or less.

However, it is preferable that the first substrate and the second substrate respectively have a structure including at least one insulating layer whose average coefficient of thermal expansion along the substrate inplane direction at from 25 degrees centigrade to the glass transition point is 35 ppm/degrees centigrade or less, and preferably 30 ppm/degrees centigrade or less.

Although in the said embodiment, the first substrate 3 and the second substrate 5 are substrates that have the core layer 32 respectively, the present invention is not limited to this, but they may be substrates made of only the built-up layers. By using such substrates, it is possible to make thin the shape of the semiconductor device.

Moreover, in the said embodiment, although the insulating layer 311 is one that is not reinforced by fibers, the present invention is not limited to this, but the insulating layer 311 may be one including glass fibers and the like. By so doing, it is possible to further reduce the average coefficient of thermal expansion of the insulating layer 311 along the substrate thickness direction.

Figure 8:
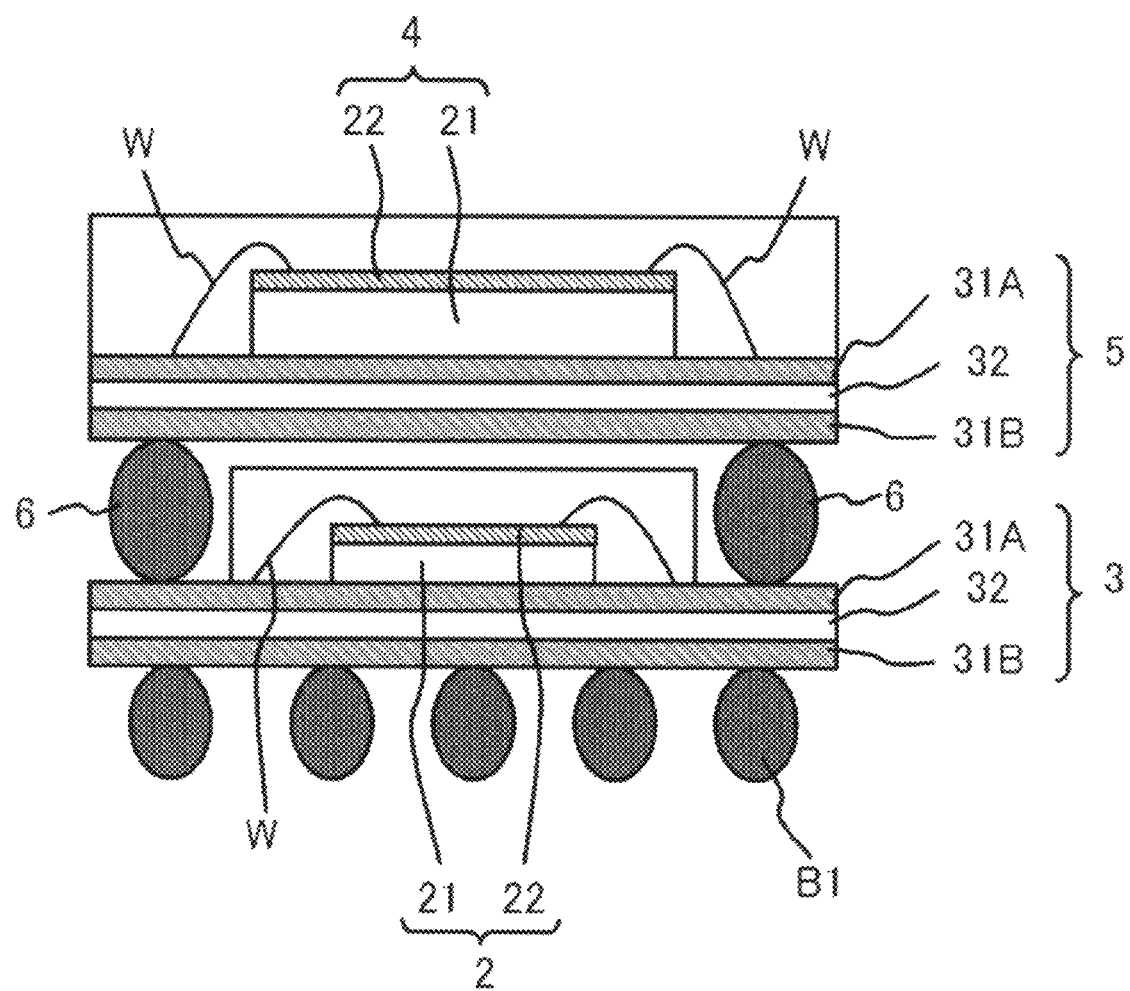
FIG. 8 is a cross sectional view showing a semiconductor device according to a modified embodiment of the present invention.

Furthermore, although in the said embodiment, the first substrate 3 and the first semiconductor chip 2, and the second substrate 5 and the second semiconductor chip 4 are connected by the solder bumps B2, however, the present invention is not limited to this, but for example, as shown in FIG. 8, they may be connected by bonding wires W.

Further, although in the said embodiment, a semiconductor device that has a pair of substrates and a pair of semiconductor chips, that is, a semiconductor device wherein two semiconductor packages are laminated, has been illustrated, however, the present invention is not limited to this, but three or more semiconductor packages may be laminated. In the case of laminating three or more semiconductor packages, it is preferable that all the insulating layers of the built-up layers of each substrates in three or more semiconductor packages have the average coefficient of thermal expansion along the substrate inplane direction at from 25 degrees centigrade to the glass transition point of 35 ppm/degrees centigrade or less, and the average coefficient of thermal expansion along the substrate thickness direction of 35 ppm/degrees centigrade or less. Furthermore, it is preferable that all the insulating layers of the built-up layers of each substrates contain a cyanate resin, in particular a novolac type cyanate resin.

Figure 9:
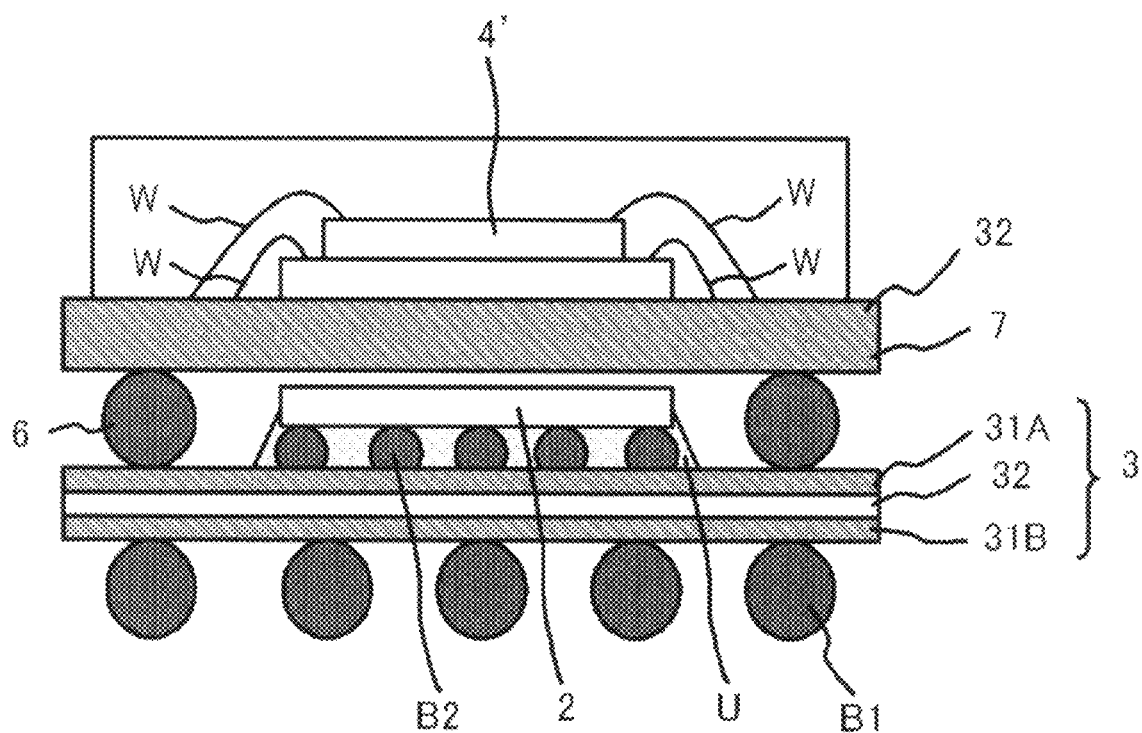
FIG. 9 is a cross sectional view showing a semiconductor device according to a modified embodiment of the present invention.

Moreover, although in the said embodiment, the first substrate and the second substrate are substrates that have the built-up layers and the core layer, however, the present invention is not limited to this, but as shown in FIG. 9, the second substrate may be a substrate 7 that is made of a core layer and does not have built-up layers.

Specifically, the first substrate may be one that has the built-up layers 31A and 31B and the core layer, and the second substrate 7 may be one that has the core layer 32.

By so doing, it is possible to eliminate the built-up layers whose coefficient of thermal expansion is liable to become comparatively large, and make small the mismatch with the coefficient of thermal expansion of a semiconductor chip, and accordingly it becomes possible to control the occurrence of tic cracks surely.

In addition, the second semiconductor chip 4' in FIG. 9 has a stack structure of two layers. Moreover, the second semiconductor chip 4' and the second substrate 7 are connected by a wire W.

Furthermore, at least one layer of the insulating layer of the built-up layers 31A and 31B of the first substrate in FIG. 9 may have the average coefficient of thermal expansion along the substrate inplane direction at from 25 degrees centigrade to the glass transition point of 35 ppm/degrees centigrade or less, and the average coefficient of thermal expansion along the substrate thickness direction of 35 ppm/degrees centigrade or less.

EXAMPLES

Next, embodiments of the present invention are explained hereinafter.

First Example

A semiconductor device of approximately the same structure as that of the said embodiment was manufactured. Meanwhile, although in the said embodiment, the solder bump is provided in the back surface of the first substrate, in the first example, a terminal was provided for detecting the connecting resistance between substrates.

The first substrate and the second substrate are composed of the same layer structure and substrate material. Specifically, the first substrate and the second substrate are equipped with the built-up layers (approximately 36 micrometers in thickness) where three layers of insulating layers and four layers of conductor interconnect layers are arranged alternately, and a core layer (45 micrometers in thickness).

In Table 1, the resin composition of the insulating layers of the built-up layers used in the first substrate and the second substrate is shown. Further, the resin composition of the insulating layer of the core layer used in the first substrate and the second substrate is shown in Table 1.

The first substrate and the second substrate were produced by well-known manufacture method.

Furthermore, the material of the solder bump as the connecting section was Sn—Ag3.0-Cu0.5 (coefficient of thermal expansion being 21.7 ppm/degrees centigrade). On the first substrate, the solder bumps were arranged along with the outer circumference of the first resin, and connected with the second substrate.

Moreover, the material of the solder bumps arranged between the first substrate and the first semiconductor chip (100 micrometers in thickness) and the material of the solder bumps arranged between the second substrate and the second semiconductor chip (350 micrometers in thickness) were Sn-95Pb (coefficient of thermal expansion being 29.0 ppm/degrees centigrade).

Further, as the underfill, one whose elastic modulus was 300 MPa under 125 degrees centigrade atmosphere, and whose average coefficients of thermal expansion at from 25 degrees centigrade to the glass transition point was 25 ppm/degrees centigrade was used.

In addition, the measurement method of the coefficient of elasticity and the average coefficient of thermal expansion of the underfill are as mentioned in the said embodiment.

TABLE 1

| | | Parts by weight | |
|---|---|---|---|
| Resin | Product name and others | Insulating layer of core layer | Insulating layer of build-up layer |
| Cyanate resin | Novolac type cyanate resin: Primaset PT-30 manufactured by Lonza, weight average molecular weight 700 | 19.7 | 25.0 |
| Epoxy resin | Biphenyl dimethylene type epoxy resin: NC-3000 manufactured by Nippon Kayaku Co., Ltd., epoxy equivalent 275, weight average molecular weight 2000 | 11.0 | 24.7 |
| Phenoxy resin | Copolymer of biphenyl epoxy resin and bisphenol S epoxy resin, having an epoxy group at the terminal: YX-8100H30 manufactured by Japan Epoxy Resins Co., Ltd., weight average molecular weight 30,000 | | 10.0 |
| Hardener | Biphenyl dimethylen type phenol resin: MEH-7851-3H manufactured by MEIWA PLASTIC INDUSTRIES, LTD., hydroxy group equivalent 230 | 9.0 | |
| Curing catalyst | Imidasol compound: 1B2PZ manufactured by SHIKOKU CHEMICALS CORPORATION, 1-benzyl-2-phenyl imidasol | | 0.1 |
| Inorganic filler | Spherically shaped molten silica: SO-25H manufactured by Admatechs Co., Ltd., average particle diameter 0.5 μm | 60 | 40 |
| Coupling agent | Epoxy silane coupling agent: A-187 manufactured by GE Toshiba Silicones Co., Ltd. | 0.3 | 0.2 |
| Fiber base material | | Glass cloth #1035 E glass, 27 μm in thickness | None |

The first and second substrates were each configured as follows.

Plane shape: square of 34 mm×34 mm,

Board thickness: 0.2 mm,

Conductor interconnect layer: 12 μm thick (conductor interconnect layer of the built-up layer surface), 18 μm thick (conductor interconnect layer arranged on core layer)

Solder resist thickness (thickness from the circuit upper surface): 12 μm,

Circuit interval (diameter of the opening of the conductor interconnect layer)/circuit width (interval between the adjacent openings of the conductor interconnect layer)=300 μm/300 μm, Circuit shape (shape of the opening of the conductor interconnect layer): circular

Second Example

The composition of the insulating layer of the built-up layer was made as follows. Other points are the same as those in the first example.

TABLE 2

| Resin | Product name and others | Insulating layer of the build-up layer |
|---|---|---|
| Cyanate resin | Novolac type cyanate resin: Primaset PT-30 manufactured by Lonza, weight average molecular weight 700 | 29.2 |

TABLE 2-continued

| Resin | Product name and others | Insulating layer of the build-up layer |
|---|---|---|
| Epoxy resin | Biphenyl dimethylene type epoxy resin: NC-3000 manufactured by Nippon Kayaku Co., Ltd., epoxy equivalent 275, weight average molecular weight 2000 | 28.8 |
| Phenoxy resin | Copolymer of a biphenyl epoxy resin and a bisphenol S epoxy resin, having an epoxy group at the terminal: YX-8100H30 manufactured by Japan Epoxy Resins Co., Ltd., weight average molecular weight 30,000 | 11.7 |
| Curing catalyst | Imidasol compound: 1B2PZ manufactured by SHIKOKU CHEMICALS CORPORATION, 1-benzil-2-phenyl imidasol | 0.1 |
| Inorganic filler | Spherically shaped molten silica: SO-25H manufactured by Admatechs Co., Ltd., average particle diameter 0.5 μm | 30.0 |
| Coupling agent | Epoxy silane coupling agent: A-187 manufactured by Toshiba Silicones Co., Ltd. | 0.2 |

Third Example

The composition of the insulating layer of the core layer was made as follows. Other points are the same as those in the first example.

The average coefficient of thermal expansion of the insulating layer of the core along the substrate inplane direction at from 25 degrees centigrade to the glass transition point was 8 ppm/degrees centigrade, and the average coefficient of thermal expansion along the substrate thickness direction at from 25 degrees centigrade to the glass transition point was 12 ppm/degrees centigrade.

TABLE 3

| Resin | Product name and others | Insulating layer of the core layer |
|---|---|---|
| Cyanate resin | Novolac type cyanate resin: Primaset PT-30 manufactured by Lonza, weight average molecular weight 700 | 17.4 |
| Epoxy resin | Biphenyl dimethylene type epoxy resin: NC-3000 manufactured by Nippon Kayaku Co., Ltd., epoxy equivalent 275, weight average molecular weight 2000 | 9.8 |
| Phenoxy resin | Biphenyl dimethylen type phenol resin: MEH-7851-3H manufactured by MEIWA PLASTIC INDUSTRIES, LTD., hydroxy group equivalent 230 | 7.5 |
| Curing catalyst | Imidasol compound: 1B2PZ manufactured by SHIKOKU CHEMICALS CORPORATION, 1-benzil-2-phenyl imidasol | 0.1 |
| Inorganic filler | Spherically shaped molten silica: SO-25H manufactured by Admatechs Co., Ltd., average particle diameter 0.5 μm | 64.9 |
| Coupling agent | Epoxy silane coupling agent: A-187 manufactured by GE Toshiba Silicones Co., Ltd. | 0.3 |

TABLE 3-continued

| Resin | Product name and others | Insulating layer of the core layer |
|---|---|---|
| Fiber base material | | Glass cloth #1035 E glass, 27 μm in thickness |

Fourth Example

The insulating layer of the built-up layer of the second example, and the insulating layer of the core layer of the third example were used, and the first substrate and the second substrate were prepared. Other points are the same as those in the first example.

Fifth Example

The same substrate as in the second example was used as the first substrate. A substrate that does not have a built-up layer but has only a core layer was adopted as the second substrate. The core layer of the second substrate is the same as the core layer of the first example. Other points are the same as those in the first example.

First Comparative Example

As the core layers of the first and the second substrates, a BT board (CCL-HL832HS Type HS manufactured by Mitsubishi Gas Chemical Co., Inc.) was used. Further, ABFGX-13 (manufactured by Ajinomoto Co., Inc.) was used as the insulating layers of the built-up layers of the first substrate and the second substrate.

(Average Coefficient of Thermal Expansion and Glass Transition Point)

The average coefficients of thermal expansion, and the glass transition point of the insulating layer of the core layer of the first substrates of each examples and the comparative example, the average coefficients of thermal expansion, and the glass transition point of the insulating layers of the build-up layers, the average coefficients of thermal expansion, and the glass transition point of the insulating layer of the core layer of the second substrate, and the average coefficients of thermal expansion, and the glass transition point of the insulating layers of the build-up layers were measured respectively.

The measurement methods of the average coefficient of thermal expansion and the glass transition point are the same as the methods described in the said embodiment. The result is shown in Table 4. The units of the average coefficient of thermal expansion in Table 4 are ppm/degrees centigrade, and the unit of the glass transition point is degree centigrade.

(Evaluation of Chip Crack)

The presence and absence of the chip cracks in the first semiconductor chip of the semiconductor devices obtained by each examples and the comparative example were observed by an SAT (Scan Acoustic Tomograph: ultrasonic flaw detector), and those without chip cracks was indicated by "O", and those with chip cracks was indicated by "X". The evaluation result is shown in Table 4.

(Evaluation of Conductive Failure)

To the semiconductor devices obtained in each examples and the comparative example, 1000 cycles of temperature cycle tests were carried out for one hour at −55 degrees centigrade, and for one hour at 125 degrees centigrade. The connecting resistance values between adjacent terminals provided in the back surface of the first substrates before and after the temperature cycle tests were measured by the 4-terminal method at ten points. The points where the connecting resistance value after the tests became 5 times or more of the connecting resistance value before the tests were counted as points of conductive failure. The evaluation result is shown in Table 4.

TABLE 4

|  |  |  | Average coefficient of thermal expansion (along the substrate thickness direction) | Average coefficient of thermal expansion (along the substrate inplane direction) | Glass transition point | Chip crack | Conductive failure |
|---|---|---|---|---|---|---|---|
| First example | First substrate | Insulating layers of the build-up layers | 30 | 30 | 180 | ○ | 0/10 |
|  |  | Insulating layer of the core layer | 16 | 11 | 220 |  |  |
|  | Second substrate | Insulating layers of the build-up layers | 30 | 30 | 180 |  |  |
|  |  | Insulating layer of the core layer | 16 | 11 | 220 |  |  |
| Second example | First substrate | Insulating layers of the build-up layers | 35 | 35 | 180 | ○ | 0/10 |
|  |  | Insulating layer of the core layer | 16 | 11 | 220 |  |  |
|  | Second substrate | Insulating layers of the build-up layers | 35 | 35 | 180 |  |  |
|  |  | Insulating layer of the core layer | 16 | 11 | 220 |  |  |
| Third example | First substrate | Insulating layers of the build-up layers | 30 | 30 | 180 | ○ | 0/10 |
|  |  | Insulating layer of the core layer | 12 | 8 | 220 |  |  |
|  | Second substrate | Insulating layers of the build-up layers | 30 | 30 | 180 |  |  |
|  |  | Insulating layer of the core layer | 12 | 8 | 220 |  |  |
| Fourth example | First substrate | Insulating layers of the build-up layers | 35 | 35 | 180 | ○ | 0/10 |
|  |  | Insulating layer of the core layer | 12 | 8 | 220 |  |  |
|  | Second substrate | Insulating layers of the build-up layers | 35 | 35 | 180 |  |  |
|  |  | Insulating layer of the core layer | 12 | 8 | 220 |  |  |

TABLE 4-continued

|  |  |  | Average coefficient of thermal expansion (along the substrate thickness direction) | Average coefficient of thermal expansion (along the substrate inplane direction) | Glass transition point | Chip crack | Conductive failure |
|---|---|---|---|---|---|---|---|
| Fifth example | First substrate | Insulating layers of the build-up layers | 35 | 35 | 180 | ○ | 0/10 |
|  |  | Insulating layer of the core layer | 16 | 11 | 220 |  |  |
|  | Second substrate | Insulating layer of the core layer | 16 | 11 | 220 |  |  |
| Comparative example | First substrate | Insulating layers of the build-up layers | 47 | 46 | 185 | X | 10/10 |
|  |  | Insulating layer of the core layer | 45 | 14 | 156 |  |  |
|  | Second substrate | Insulating layers of the build-up layers | 47 | 46 | 185 |  |  |
|  |  | Insulating layer of the core layer | 45 | 14 | 156 |  |  |

It has been found that in the examples, the occurrence of the chip cracks is reduced and the occurrence of conductive failure is reduced in comparison with the comparative example. From the above, it is thought that in the semiconductor devices of the examples, in comparison with the semiconductor device of the comparative example, the warpage of the first substrate and the second substrate is reduced.

The invention claimed is:

1. A semiconductor device, comprising:
a first substrate on which a first semiconductor chip is mounted;
a second substrate on which a second semiconductor chip is mounted; and
connecting sections that contact the front surface of said first substrate and the back surface of said second substrate, and electrically connect said first substrate and said second substrate; wherein
said first substrate has a build-up layer in which insulating layers containing a resin and conductor interconnect layers are laminated alternately, and said each conductor interconnect layer is connected by a conductive layer provided in a hole of said insulating layer,
said second substrate has build-up layer in which insulating layers containing a resin and conductor interconnect layers are laminated alternately, and said each conductor interconnect layer is connected by a conductive layer arranged in a hole of said insulating layer,
among the insulating layers of said build-up layer in at least one substrate of said first substrate and said second substrate, in at least one insulating layer, the average coefficient of thermal expansion along the substrate inplane direction at from 25 degrees centigrade to the glass transition point is 30 ppm/degrees centigrade or less, and the average coefficient of thermal expansion along the substrate thickness direction at from 25 degrees centigrade to the glass transition point is 30 ppm/degrees centigrade or less,
at least one substrate of said first substrate and said second substrates has a core layer wherein a through-hole provided with a conductive layer is formed in the inside of an insulating layer, and said conductive layer in the through-hole is connected to said conductor interconnect layer of said built-up layer, and
the core layer contains a resin and a glass fiber, and wherein
the average coefficient of thermal expansion along the substrate inplane direction of said insulating layer of said core layer at 25 degrees centigrade to the glass transition point is 12 ppm/degrees centigrade or less, and the average coefficient of thermal expansion along the substrate thickness direction of said insulating layer of said core layer at 25 degrees centigrade to the glass transition point is 20 ppm/degrees centigrade or less,
the average coefficient of thermal expansion along the substrate inplane direction of said insulating layer of said core layer at from 25 degrees centigrade to the glass transition point is lower than that of said build-up layer, and
the average coefficient of thermal expansion along the substrate thickness direction of said insulating layer of said core layer at from 25 degrees centigrade to the glass transition point is lower than that of said build-up layer,
whereby the core layer serves to reduce the coefficient of thermal expansion of the first and second substrates.

2. The semiconductor device as set forth in claim 1, wherein
said insulating layer, whose average coefficient of thermal expansion along the substrate inplane direction at from 25 degrees centigrade to the glass transition point is 30 ppm/degrees centigrade or less, and whose average coefficient of thermal expansion along the substrate thickness direction at from 25 degrees centigrade to the glass transition point is 30 ppm/degrees centigrade or less, include a cyanate resin.

3. The semiconductor device as set forth in claim 2, wherein
said cyanate resin is a novolac type cyanate resin.

4. The semiconductor device as set forth in claim 1, wherein
the average coefficient of thermal expansion along the substrate inplane direction of said insulating layer of said core layer at from 25 degrees centigrade to the glass transition point is 8 ppm/degrees centigrade or less.

5. The semiconductor device as set forth in claim 4, wherein
a pair of said built-up layers are arranged so as to sandwich said core layer, and
the coefficients of thermal expansion of said insulating layers of said build-up layers arranged at an approximately symmetrical position to sandwich said core layer are approximately equal.

6. The semiconductor device as set forth in claim 1, wherein
the resin of said insulating layer of said core layer includes a cyanate resin.

7. The semiconductor device as set forth in claim 6, wherein
said cyanate resin is a novolac type cyanate resin.

8. The semiconductor device as set forth in claim 6, wherein
all the insulating layers of the built-up layer of said first substrate and all the insulating layers of the built-up layer of said second substrate have the average coefficient of thermal expansion along the substrate inplane direction at from 25 degrees centigrade to the glass transition point of 30 ppm/degrees centigrade or less, and the average coefficient of thermal expansion along the substrate thickness direction at from 25 degrees centigrade to the glass transition point of 30 ppm/degrees centigrade or less, and
all the insulating layers of the built-up layer of said first substrate and all the insulating layers of the built-up layer of said second substrate contain a cyanate resin.

9. The semiconductor device as set forth in claim 8, wherein
said cyanate resin that is contained in said built-up layer and said core layer is a novolac type cyanate resin.

10. The semiconductor device as set forth in claim 1, wherein
said first substrate and said first semiconductor chip are connected with bumps,
an underfill is provided in the circumference of said bumps that connect said first substrate and said first semiconductor chip,
said second substrate and said second semiconductor chip are connected with bumps,
an underfill is provided in the circumference of said bumps that connect said second substrate and said second semiconductor chip, and
said respective underfills are made of a resin material whose coefficient of elasticity in atmosphere at 125 degrees centigrade is 150 MPa or more and 800 MPa or less.

11. The semiconductor device as set forth in claim 10, wherein
the average coefficient of thermal expansion of said respective underfills at from 25 degrees centigrade to the glass transition point is 40 ppm/degrees centigrade or less.

12. The semiconductor device as set forth in claim 1, wherein
said connecting sections are solder bumps.

13. The semiconductor device as set forth in claim 1, wherein the core layer has a composition that is different from the build-up layers.

14. The semiconductor device as set forth in claim 13, wherein the build-up layers lack a fiber base material.

15. A semiconductor device, comprising:
a first substrate on which a first semiconductor chip is mounted;
a second substrate on which a second semiconductor chip is mounted; and
connecting sections that contact the front surface of said first substrate and the back surface of said second substrate, and electrically connect said first substrate and said second substrate; wherein
said first substrate has a build-up layer in which insulating layers containing resin and conductor interconnect layers are laminated alternately, and said each conductor interconnect layer is connected by a conductive layer provided in a hole of said insulating layer,
among the insulating layers of said build-up layer of said first substrate, in at least one insulating layer, the average coefficient of thermal expansion along the substrate inplane direction at from 25 degrees centigrade to the glass transition point is 35 ppm/degrees centigrade or less, and the average coefficient of thermal expansion along the substrate thickness direction at from 25 degrees centigrade to the glass transition point is 35 ppm/degrees centigrade or less
at least one substrate of said first substrate and said second substrates has a core layer wherein a through-hole provided with a conductive layer is formed in the inside of an insulating layer, and said conductive layer in the through-hole is connected to said conductor interconnect layer of said built-up layer, and
the core layer contains a resin and a glass fiber, and wherein
the average coefficient of thermal expansion along the substrate inplane direction of said insulating layer of said core layer at 25 degrees centigrade to the glass transition point is 12 ppm/degrees centigrade or less, and the average coefficient of thermal expansion along the substrate thickness direction of said insulating layer of said core layer at 25 degrees centigrade to the glass transition point is 20 ppm/degrees centigrade or less,
the average coefficient of thermal expansion along the substrate inplane direction of said insulating layer of said corer layer at from 25 degrees centigrade to the glass transition point is lower than that of said build-up layer, and
the average coefficient of thermal expansion along the substrate thickness direction of said insulating layer of said core layer at from 25 degrees centigrade to the glass transition point is lower than that of said build-up layer,
whereby the core layer serves to reduce the coefficient of thermal expansion of the first and second substrates.

16. The semiconductor device as set forth in claim 15, wherein
said second substrate has a build-up layer in which insulating layers containing resin and conductor interconnect layers are laminated alternately, and said each conductor interconnect layer is connected by a conductive layer provided in a hole of said insulating layer, and
among the insulating layers of said build-up layer of said second substrate, in at least one insulating layer the average coefficient of thermal expansion along the substrate inplane direction at from 25 degrees centigrade to the glass transition point is 35 ppm/degrees centigrade or less, and the average coefficient of thermal expansion along the substrate thickness direction at from 25 degrees centigrade to the glass transition point is 35 ppm/degrees centigrade or less.

17. The semiconductor device as set forth in claim 15, wherein all the insulating layers of said built-up layer of said first substrate have the average coefficient of thermal expansion along the substrate inplane direction at from 25 degrees centigrade to the glass transition point of 35 ppm/degrees centigrade or less, and the average coefficient of thermal expansion along the substrate thickness direction at from 25 degrees centigrade to the glass transition point of 35 ppm/degrees centigrade or less, and the insulating layers of said built-up layer of said first substrate contain a cyanate resin.

18. The semiconductor device as set forth in claim 17, wherein said cyanate resin is a novolac type cyanate resin.

* * * * *